United States Patent [19]

Yu

[11] Patent Number: 5,106,779
[45] Date of Patent: Apr. 21, 1992

[54] METHOD FOR WIDENING THE LASER PLANARIZATION PROCESS WINDOW FOR METALIZED FILMS ON SEMICONDUCTOR WAFERS

[75] Inventor: Chang Yu, Boise, Id.

[73] Assignee: Micron Technology, Inc., Boise, Id.

[21] Appl. No.: 622,935

[22] Filed: Dec. 6, 1990

[51] Int. Cl.$^5$ ............................................. H01L 21/268
[52] U.S. Cl. ........................... 437/174; 148/DIG. 134; 437/173; 437/245; 427/53.1
[58] Field of Search ............... 437/173, 174, 187, 194, 437/197, 199, 245, 203; 148/DIG. 46, DIG. 90, DIG. 93, DIG. 134; 427/53.1

[56] References Cited

U.S. PATENT DOCUMENTS

| | | | |
|---|---|---|---|
| 4,674,176 | 6/1987 | Tuckerman | 29/591 |
| 4,681,795 | 7/1987 | Tuckerman | 428/209 |
| 4,758,533 | 7/1988 | Mage et al. | 437/173 |
| 4,920,707 | 4/1990 | Mukai | 437/173 |
| 5,032,233 | 7/1991 | Yu | 204/192.28 |

OTHER PUBLICATIONS

Wolf et al., "Silicon Processing for the VLSI Era", vol. 2, Lattice Press, Sunset Beach, Calif. (1990), pp. 255-256.
Liu et al., "A Study of Pulsed Laser Planarization of Aluminum for VLSI Metallization", Sixth International IEEE VLSI Multilevel Interconnection Conference Proceedings, Jun. 12-13 (1989), pp. 329-335.

Primary Examiner—Olik Chaudhuri
Assistant Examiner—Ken Horton
Attorney, Agent, or Firm—Wells, St. John & Roberts

[57] ABSTRACT

The invention relates to taking advantage of increasing the boiling point of a material by increasing pressure within the processing chamber, which will then push the optical ablation limit to a higher optical fluence (laser intensity). A method in accordance with the invention of planarizing a metallic film on a semiconductor wafer employing laser energy comprises: a) injecting an inert gas into a laser planarization chamber to provide a desired pressure within the chamber which is above 1 Torr; and b) selectively applying laser energy to the metallic film within the chamber containing the inert gas and maintained at a pressure greater than 1 Torr. Increasing pressure within the chamber in this manner will raise the boiling temperature of the particular metallic film without a corresponding significant increase in the melting temperature of the metallic film.

12 Claims, No Drawings

METHOD FOR WIDENING THE LASER PLANARIZATION PROCESS WINDOW FOR METALIZED FILMS ON SEMICONDUCTOR WAFERS

TECHNICAL FIELD

This disclosure relates generally to metallization of integrated circuits, and more particularly to improvements in laser planarization of deposited conductive metal films at steps and contact holes/vias about a covered surface on an integrated circuit die.

BACKGROUND OF THE INVENTION

In the metallization step utilized preparatory to etching of conductors about the outer surface of an integrated circuit, step-coverage of conductive metal films (typically aluminum or aluminum alloys) is poor over surface discontinuities, such as recesses and contact holes/vias. The problem becomes progressively worse as the dimensions of components on the integrated circuit shrink. Poor step coverage is a result of the shadow effect in the deposited film at the sidewalls of steps or holes.

Poor step coverage can be overcome to some degree by selective chemical vapor deposition of tungsten, by a metal deposition using high temperature and/or bias sputtering, or by supplemental metallic deposition using multiple alternation sequences involving a combination of evaporation and resputtering. However, improvements in step coverage from such methods are achieved at the expense of several drawbacks. For example, high temperature and/or bias sputtering results in poor film quality in terms of surface morphology, electromigration lifetime (for bias sputtering) and increased argon incorporation. For these reasons, high deposition temperature and/or bias sputtering is normally avoided in standard metallizing processes. Regarding chemical vapor deposition of tungsten, the resulting film resistivity is about three times higher than that of aluminum or aluminum alloys. Accordingly, aluminum and its alloys remain the materials of choice for enhanced conductivity and reliability in the finished product.

Planarization of the conductive films is another method of obtaining improved step coverage, as compared to the as deposited film quality. The use of lasers or pulse lasers to melt and planarize Al thin films to fill high aspect ratio contact holes/vias is a very attractive approach to Ultra Large Scale Integrated (ULSI) circuit metallization. Laser planarization is a low thermal budget, simple, and effective technique for planarizing metal layers and filling inter-level contacts at the cost of only one additional step to the standard process flow. Excimer laser planarization, one technique, relies on a very short laser pulse to rapidly melt an absorbing metal layer. During the molten period, mass transport of the conductive metal occurs which results in flow of the metal into contact holes/vias, and drives the film surface flat due to the high surface tension and low viscosity of molten metals.

The technique of laser planarization has shown promise in improving step coverage of aluminum alloy films in micron/submicron geometry contacts and contact vias. However, laser planarization of aluminum containing metal films is not without drawbacks. First, aluminum is a highly reflective metal which reflects approximately 93% of wavelengths in the region down to 200 nm. Accordingly, aluminum films reflect a significant amount of laser energy which results in inefficient energy use in laser planarization of aluminum films.

Second, laser planarization is typically conducted in an evacuated chamber at very low, vacuum-like pressures. The intent is to eliminate oxygen to avoid degradation reactions which would otherwise occur during the process. Typical pressures within the laser planarization chambers are between $10^{-8}$ to $10^{-5}$ Torr. Under these conditions, the vaporization/boiling temperatures of aluminum are 1000° C. and 1200° C., respectively. Accordingly, care must be exercised to assure that the applied laser energy will not raise the temperature of the aluminum film to above the 1000° C. to 1200° C. vaporization temperature, which would cause the aluminum from the applied film to ablate from the wafer surface. On the other hand, the applied energy must be at least sufficient to cause aluminum melting to achieve the desired step coverage/planarization effect.

The range between ablation temperature and melting temperature for a given metal or alloy at the typical $10^{-8}$ to $10^{-5}$ Torr pressure conditions is commonly referred to as the process window. In production, conditions must be maintained within this window to achieve suitable results. The closer the melting temperature and ablation temperature are to one another, the narrower the process window and accordingly the more tedious and difficult production becomes.

One way of widening the process window is to use different metals than aluminum, or alloy aluminum with metals having higher ablation temperatures. For example, the boiling/vaporization temperature of titanium is about 1500° C. at $10^{-6}$ Torr. However, the drawbacks inherent with use of titanium have been identified above. Other metals which aluminum might be alloyed with have boiling temperatures which are very close to those of aluminum at the typical process pressures of $10^{-8}$ and $10^{-5}$ Torr, and accordingly provide little improvement.

A general discussion of laser planarization can be found in the text entitled "Silicon Processing For the VLSI Era" (Vol. 2—Process Integration), by S. Wolf, published (1990) by Lattice Press, Sunset Beach, Calif. at Section 4.5.6.2—Laser Planarization of Al Films, pages 255, 256, which is hereby incorporated by reference.

Accordingly, a need remains for widening the process window for laser planarization of metallic films in general, and aluminum containing films in particular.

DETAILED DESCRIPTION OF THE PREFERRED EMBODIMENTS

The following disclosure of the invention is submitted in furtherance with the constitutional purpose of the Patent Laws "to promote the progress of science and useful arts" (Article 1, Section 8).

The invention relates to taking advantage of increasing the boiling point of a material by increasing pressure within the processing chamber, which will then push the optical ablation limit to a higher optical fluence (laser intensity). A method in accordance with the invention of planarizing a metallic film on a semiconductor wafer employing laser energy comprises: a) injecting an inert gas into a laser planarization chamber to provide a desired pressure within the chamber which is above 1 Torr; and b) selectively applying laser energy to the metallic film within the chamber containing the inert gas and maintained at a pressure greater than 1

Torr. Increasing pressure within the chamber in this manner will raise the boiling temperature of the particular metallic film without a corresponding significant increase in the melting temperature of the metallic film.

Examples of inert gases include Ar, $N_2$, Kr, or mixtures thereof. In the context of this disclosure, the term "inert" refers to a gaseous substance that would not cause or instigate undesirable chemical reactions at the wafer surface during the planarization process.

For a given set of processing parameters, methods in accordance with the invention may tend to reduce the molten time of the aluminum metal due to heat conduction from the wafer to the gas within the chamber. However, the benefits gained in pushing the optical ablation limit to a higher optical fluence will be much more significant in widening the process window, and expect to overshadow any requirement for longer laser energy application to provide sufficient molten time for the film for planarization.

The method should have advantageous application to planarizing of aluminum containing films by significantly widening the laser planarization process window. The preferred pressure provided by the injected inert gas within the processing chamber is preferably about one atmosphere. The process window (PW) for complete contact/via filling using a laser planarization process is defined by:

$$PW = (F_a - F_f)/(F_a + F_f) \quad (1)$$

where $F_a$ is the minimum laser fluence to cause optical ablation, and $F_f$ is the minimum laser fluence required to achieve a complete contact filling. Equation (1) above shows that for laser planarization, the upper limit of the process window is limited by the point at which optical ablation occurs. Since $F_a$ is proportional to the boiling temperature of aluminum, the process window can be significantly widened by increasing the boiling temperature of aluminum.

A process sequence in accordance with the invention would typically comprise first fabricating the particular wafer to be planarized, and positioning the wafer for planarization. The planarizing process chamber would then be filled with an inert gas (or mixture thereof) to the desired pressure. The laser planarization process would thereafter be conducted. At this writing, the invention has not yet been reduced to practice.

In compliance with the statute, the invention has been described in language more or less specific as to methodical features. It is to be understood, however, that the invention is not limited to the specific features described, since the means and construction herein disclosed comprise a preferred form of putting the invention into effect. The invention is, therefore, claimed in any of its forms or modifications within the proper scope of the appended claims appropriately interpreted in accordance with the doctrine of equivalents.

I claim:

1. A method of planarizing a metallic film on a semiconductor wafer using laser energy, the method comprising:
    injecting an inert gas into a laser planarization chamber to provide a desired pressure within the chamber which is above 1 Torr; and
    selectively applying laser energy to the metallic film within the chamber containing the inert gas and maintained at a pressure greater than 1 Torr.

2. The method of planarizing a metallic film of claim 1 wherein the inert gas is selected from the group consisting of Ar, $N_2$, and Kr, or mixtures thereof.

3. The method of planarizing a metallic film of claim 1 comprising injecting the inert gas into the laser planarization chamber to provide a pressure within the chamber which is approximately one atmosphere.

4. The method of planarizing a metallic film of claim 3 wherein the inert gas is selected from the group consisting of Ar, $N_2$, and Kr, or mixtures thereof.

5. A method of planarizing an aluminum containing film on a semiconductor wafer using laser energy, the method comprising:
    injecting an inert gas into a laser planarization chamber to provide a desired pressure within the chamber which is above 1 Torr; and
    selectively applying laser energy to the aluminum containing film within the chamber containing the inert gas and maintained at a pressure greater than 1 Torr.

6. The method of planarizing an aluminum containing film of claim 5 wherein the inert gas is selected from the group consisting of Ar, $N_2$, and Kr, or mixtures thereof.

7. The method of planarizing an aluminum containing film of claim 5 comprising injecting the inert gas into the laser planarization chamber to provide a pressure within the chamber which is approximately one atmosphere.

8. The method of planarizing an aluminum containing film of claim 7 wherein the inert gas is selected from the group consisting of Ar, $N_2$, and Kr, or mixtures thereof.

9. A method of widening the laser planarization process window for planarizing aluminum containing films comprising:
    injecting an inert gas into a laser planarization chamber to provide a desired pressure within the chamber which is above 1 Torr; and
    selectively applying laser energy to the aluminum containing film within the chamber containing the inert gas and maintained at a pressure greater than 1 Torr.

10. The method of widening the process window of claim 9 wherein the inert gas is selected from the group consisting of Ar, $N_2$, and Kr, or mixtures thereof.

11. The method of widening the process window of claim 9 comprising injecting the inert gas into the laser planarization chamber to provide a pressure within the chamber which is approximately one atmosphere.

12. The method of widening the process window of claim 11 wherein the inert gas is selected from the group consisting of Ar, $N_2$, and Kr, or mixtures thereof.

* * * * *